(12) United States Patent  
Oono et al.

(10) Patent No.: US 7,530,350 B2
(45) Date of Patent: May 12, 2009

(54) OUTPUT CIRCUIT FOR AN ON-VEHICLE ELECTRONIC DEVICE

(75) Inventors: Takashi Oono, Kariya (JP); Haruo Kawakita, Kariya (JP)

(73) Assignee: DENSO Corporation, Kariya (JP)

( * ) Notice: Subject to any disclaimer, the term of this patent is extended or adjusted under 35 U.S.C. 154(b) by 25 days.

(21) Appl. No.: 11/806,337

(22) Filed: May 31, 2007

(65) Prior Publication Data

US 2008/0006256 A1  Jan. 10, 2008

(30) Foreign Application Priority Data

Jun. 23, 2006 (JP) ............................ 2006-173797

(51) Int. Cl.
*F02P 3/05* (2006.01)
*H03K 17/60* (2006.01)

(52) U.S. Cl. .................. 123/652; 123/644; 327/478
(58) Field of Classification Search ................ 123/630, 123/644, 647, 652, 650, 651, 653, 654; 327/478, 327/110, 417
See application file for complete search history.

(56) References Cited

U.S. PATENT DOCUMENTS

| 5,571,245 | A |   | 11/1996 | Ooyabu et al. |
| 5,583,399 | A | * | 12/1996 | Rudolph ................... 315/291 |
| 5,603,308 | A | * | 2/1997 | Ooyabu et al. ............ 123/644 |
| 5,970,964 | A | * | 10/1999 | Furuhata et al. ........... 123/644 |
| 6,257,216 | B1 | * | 7/2001 | Forster et al. .............. 123/652 |
| 7,080,639 | B1 | * | 7/2006 | Pattantyus ................. 123/651 |
| 7,131,437 | B2 | * | 11/2006 | Ando et al. ................ 123/644 |

FOREIGN PATENT DOCUMENTS

JP  64-020719  1/1989
JP  08-093611  4/1996

* cited by examiner

*Primary Examiner*—Stephen K. Cronin
*Assistant Examiner*—Johnny H. Hoang
(74) *Attorney, Agent, or Firm*—Nixon & Vanderhye P.C.

(57) ABSTRACT

In an engine ignition system, an igniter for an ignition coil is connected to an ECU through a signal wire. The signal wire is grounded via the collector and the emitter of a bipolar transistor of an output circuit of the igniter. A constant current source outputs a current to the base of the bipolar transistor. Switching transistors are connected between the emitter and base of the bipolar transistor. When all the switching transistors are turned off, the bipolar transistor is turned on.

11 Claims, 4 Drawing Sheets

OUTPUT CIRCUIT FOR AN ON-VEHICLE ELECTRONIC DEVICE

CROSS REFERENCE TO RELATED APPLICATION

This application is based on and incorporates herein by reference Japanese Patent Application No. 2006-173797 filed on Jun. 23, 2006.

FIELD OF THE INVENTION

The present invention relates to an output circuit for an on-vehicle electronic device, which is provided as an interface between on-vehicle electronic devices.

BACKGROUND OF THE INVENTION

In an engine system, an electronic control unit (ECU) of a gasoline engine outputs an ignition signal, and an igniter (electronic ignition circuit) of the engine causes an ignition plug of the engine to discharge by means of an ignition coil of the engine based on the ignition signal. The igniter generates a fail-safe signal indicating whether the ignition plug has actually discharged by means of the ignition coil. The igniter feeds back the fail-safe signal to the ECU. This is disclosed in JP 8-93611A.

One example of a circuit for outputting a fail-safe signal is shown in FIG. 5. A transistor Tr1 outputs a fail-safe signal IGf through its collector to a signal wire LF. The emitter of the transistor Tr1 is grounded. A pull-down resistor Rpd is connected between the base and emitter of the transistor Tr1. The base of the transistor Tr1 is connected to a power source B via the emitter and the collector of a transistor Tr2. The base of the transistor Tr2 is grounded via the collector and the emitter of a transistor Tr3.

It is possible to switch the output of the transistor Tr1 by turning on or off the transistor Tr3. That is, it is possible to determine the logical value of the fail-safe signal IGf by turning on or off the transistor Tr3. When the transistor Tr3 is turned off, the transistor Tr2 is turned on, so that a current flows through the pull-down resistor Rpd. As a result, a bias in proportion to the voltage drop across the pull-down resistor Rpd is applied between the base and the emitter of the transistor Tr1. This turns on the transistor Tr1, making the fail-safe signal IGf logically low. When the transistor Tr3 is turned on, the transistor Tr2 is turned off, so that the pull-down resistor Rpd short-circuits the base and emitter of the transistor Tr1. This turns off the transistor Tr1, making the fail-safe signal IGf logically high.

However, when a radio noise is superposed on the signal wire LF when the transistor Tr3 is in the OFF-state, a current may flow through the pull-down resistor Rpd via the parasitic capacitance between the collector and the base of the transistor Tr1. In this case, a bias in proportion to the voltage drop across the pull-down resistor Rpd is applied between the base and the emitter of the transistor Tr1, so that this transistor Tr1 may malfunction. When the resistance of the pull-down resistor Rpd is reduced, the malfunction of the transistor Tr1 due to radio noises could be suppressed. In this case, however, the current required for the pull-down resistor Rpd to turn on the transistor Tr1 increases. When a high-capacitance capacitor is connected to the collector of the transistor Tr1, the malfunction of this transistor due to radio noises could be avoided, but the igniter would be large in size.

In general, although the output circuits of not only the igniter but also on-vehicle electronic devices are downsized, it is difficult to avoid the malfunction of the circuits due to radio noises.

SUMMARY OF THE INVENTION

The object of the present invention is to provide a small-sized output circuit for an on-vehicle electronic device which suitably avoids malfunctioning due to radio noises.

According to one aspect of the present invention, an output circuit for an on-vehicle electronic device has a bipolar transistor having a base, a collector and an emitter. The emitter and the collector are connected to a low-potential side and a high-potential side, respectively. A signal wire is connected to one of the collector and the emitter of the bipolar transistor so that the bipolar transistor outputs a signal therethrough. A resistance changing circuit is connected between the emitter and the base of the bipolar transistor, so that a reduction of the resistance between the emitter and the base turns off the bipolar transistor.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
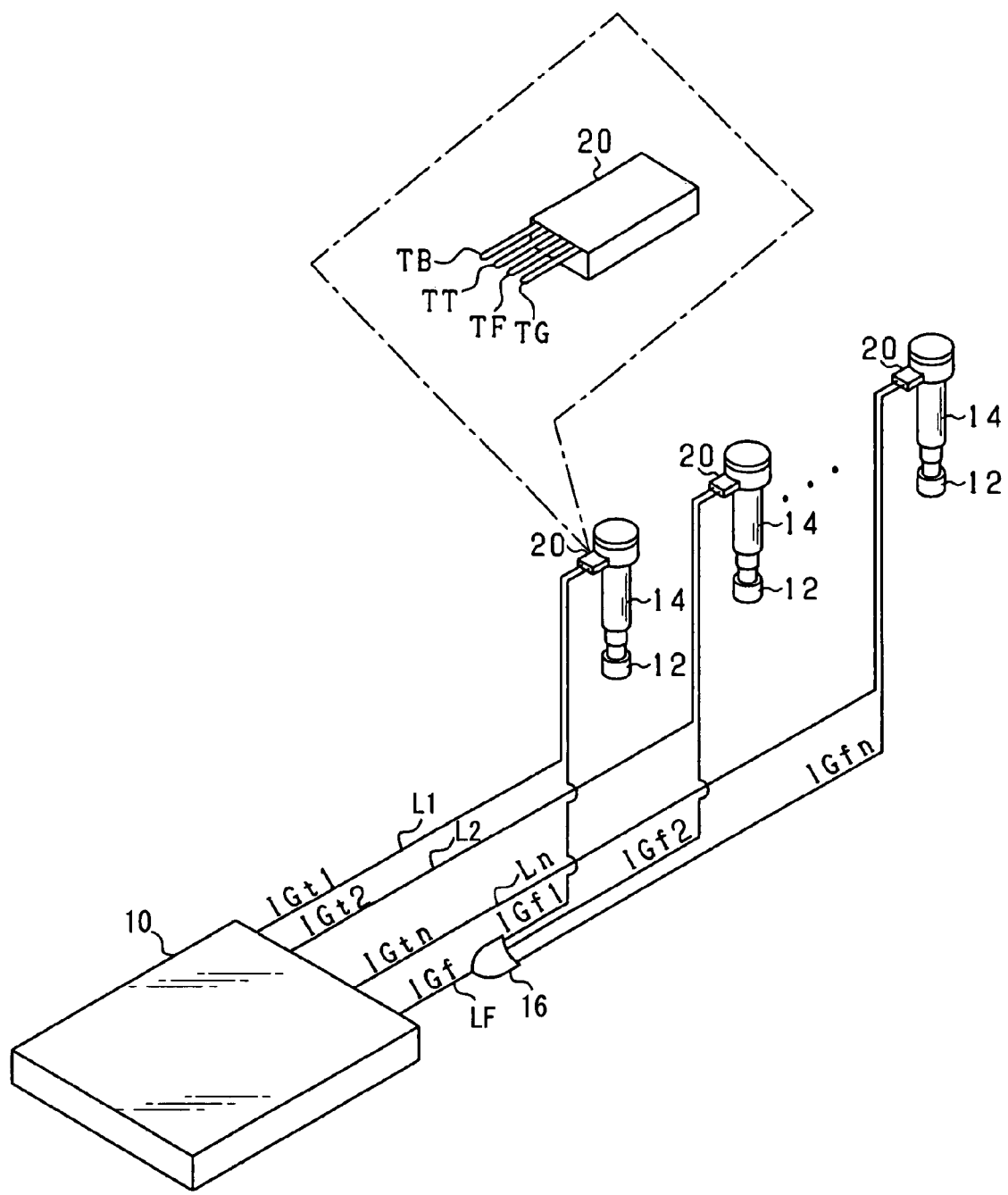
FIG. 1 is a schematic diagram showing igniters embodying the present invention and other parts.

Referring first to FIG. 1, an electronic control unit (ECU) 10 and a plurality of igniters 20 of a multi-cylinder gasoline engine are connected to each other. The ECU 10 is for controlling the output from the engine. An ignition plug 12 for each cylinder of the engine is connected to a stick coil 14, which is fitted with the igniter 20 on its head. The ECU 10 outputs ignition signals IGti (i=1 to n) through signal wires L1 to Ln to the igniters 20 of the cylinders. In response to the ignition signal IGti, the igniter 20 causes the ignition plug 12 to discharge, and the igniter 20 output a fail-safe signal IGf through a signal wire LF to the ECU 10. The fail-safe signal IGf indicates whether one or more of the ignition plugs 12 have discharged normally. More precisely, each igniter 20 output a fail-safe signal IGfi to an OR circuit 16, which outputs the fail-safe signal IGf as a logical sum signal to the signal wire LF.

As shown in an enlarged scale, the igniter 20 is a packaged electronic device, which has a ground terminal TG, an output terminal TF, an input terminal TT, and a power terminal TB. The ground terminal TG is grounded. The igniter 20 receives the ignition signal IGti through its input terminal TT and outputs the fail-safe signal IGfi through its output terminal TF. The power terminal TB of the igniter 20 is connected to a power source.

Figure 2:
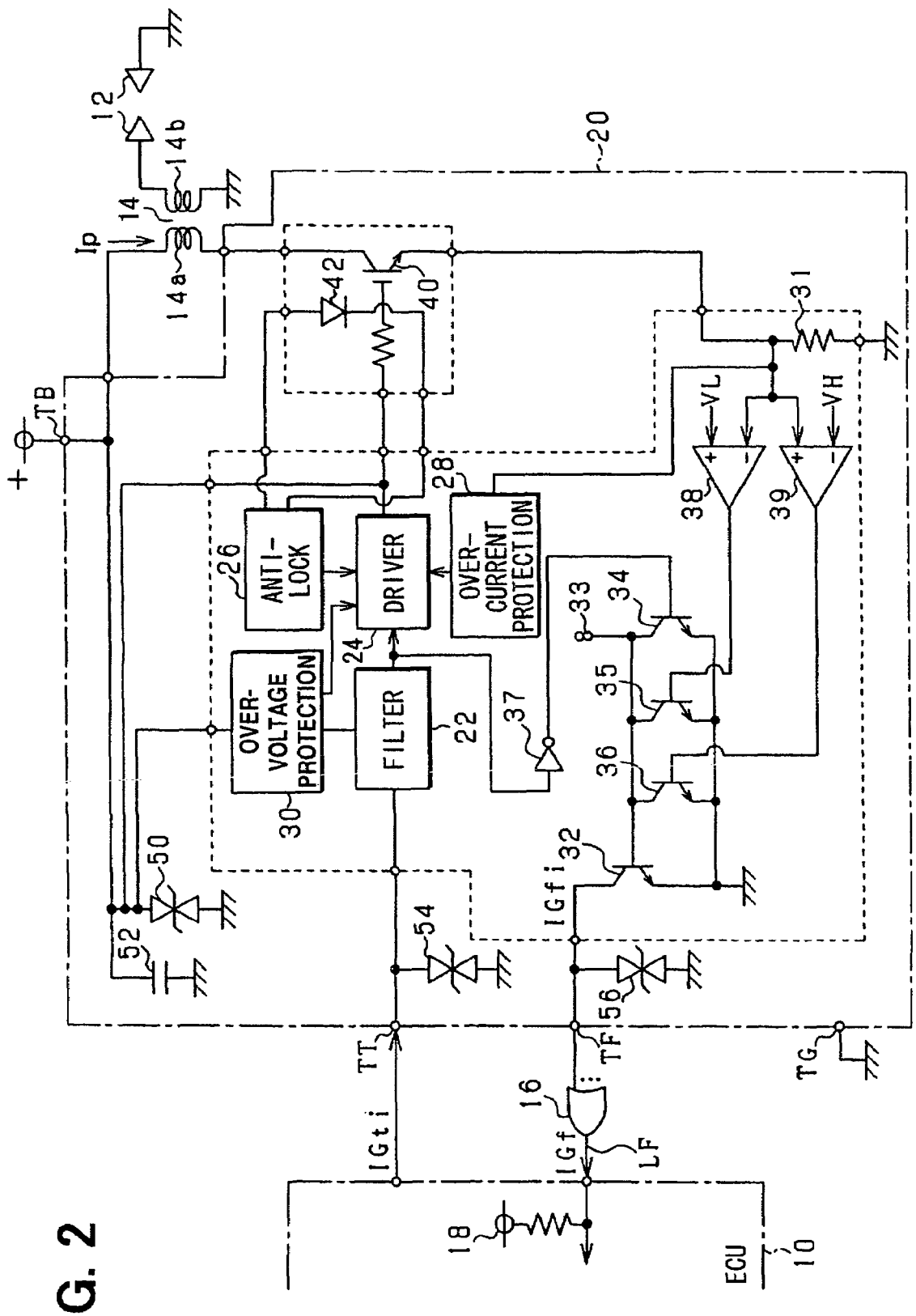
FIG. 2 is a circuit diagram showing the circuitry of each igniter.

The igniter 20 is constructed as shown in FIG. 2. The ignition signal IGti is applied through the input terminal TT. An input filter 22 shapes the waveform of the ignition signal IGti and outputs this signal to a driver circuit 24. The driver circuit 24 applies a voltage based on the ignition signal IGti to the gate of an insulated gate bipolar transistor (IGBT) 40. The voltage application causes electric conduction between the collector and the emitter of the IGBT 40. This provides conduction between the power terminal TB, the primary coil 14a of an ignition coil in the stick coil 14, and the ground, so that a current flows through the primary coil 14a. When the current through the primary coil 14a is cut off, the counter electromotive force created in the secondary coil 14b of the ignition coil causes the ignition plug 12 to discharge.

When the IGBT 40 locks into the ON-state due to some abnormality, an anti-lock circuit 26 drives the IGBT 40 into the OFF-state. The anti-lock circuit 26 detects the temperature of the IGBT 40 through a temperature sensing diode 42 positioned near the IGBT 40. When the detected temperature is higher than a preset value, the IGBT 40 is considered as being locked in the ON-state. In this case, the anti-lock circuit 26 drives the IGBT 40 into the OFF-state by means of the driver circuit 24.

An over-current protection circuit 28 inhibits over-current from flowing through the primary coil 14a. A resistor 31 is connected between the emitter of the IGBT 40 and the ground. The voltage drop across the resistor 31 is detected as the current through the primary coil 14a. When the detected current is higher than a preset value, an over-current protection circuit 28 drives the IGBT 40 into the OFF-state by means of the driver circuit 24.

The over-voltage protection circuit 30 avoids application of high voltage to circuits in the igniter 20 when the voltage applied through the power terminal TB is higher than a preset value. When the over-voltage is applied to the circuit in the igniter 20, the over-voltage protection circuit 30 drives the IGBT 40 into the OFF-state by means of the driver circuit 24 so as to prevent the IGBT 40 from being driven beyond the maximum rated power.

The igniter 20 further includes a NPN bipolar transistor 32 which outputs a fail-safe signal IGfi indicating whether the ignition plug 12 has discharged to generate an ignition spark. The emitter of the bipolar transistor 32 is grounded, and the collector of the transistor 32 is connected to the ECU 10 via the output terminal TF the OR circuit 16, and the signal wire LF, which is connected to a power source 18 in the ECU 10.

The base of the bipolar transistor 32 is connected to a constant current source 33. The constant current source 33 may include a transistor which is normally in the ON-state, and the collector and the emitter of which connect the base of the bipolar transistor 32 and the power terminal TB.

The collectors and the emitters of a first switching transistor 34, a second switching transistor 35, and a third switching transistor 36 are connected between the base and the emitter of the bipolar transistor 32. The switching transistors 34, and 36 may be NPN bipolar transistors.

An inverter 37 receives the output signal of the input filter 22 and outputs a logically inverted signal to the base of the first switching transistor 34. This keeps the first switching transistor 34 in the ON-state for the duration of the ignition signal IGti. The base of the second switching transistor 35 is connected to the output terminal of a comparator 38. The voltage at the high-potential terminal of a resistor 31 is applied to the inverting input terminal of the comparator 38. A threshold voltage VL is applied to the non-inverting input terminal of the comparator 38. When the voltage across the resistor 31 exceeds the threshold voltage VL, the second switching transistor 35 is turned off. The base of the third switching transistor 36 is connected to the output terminal of a comparator 39. A specified voltage VH higher than the threshold voltage VL is applied to the inverting input terminal of the comparator 39. The voltage at the high-potential terminal of the resistor 31 is also applied to the non-inverting input terminal of the comparator 39. When the voltage across the resistor 31 exceeds the specified voltage VH, the third switching transistor 36 is turned on.

A Zener diode 50 and a capacitor 52 are connected in parallel with the primary coil 14a. A Zener diode 54 is connected between the input terminal TT and the ground, and between the input terminal of the input filter 22 and the ground. A Zener diode 56 is connected between the collector of the bipolar transistor 32 and the ground, and between the output terminal TF and the ground.

The circuit parts surrounded by the broken lines in FIG. 2 are constructed as two integrated circuits (IC). Specifically, the circuit parts 40 and 42 are constructed as one of the ICs, and the parts 22, 24, 26, 28, 30 to 39 are constructed as the other IC. The ICs, the Zener diodes 50, 54, and 56, and the capacitor 52 are mounted on a lead frame (not shown) and connected by wire bonding.

Figure 3:
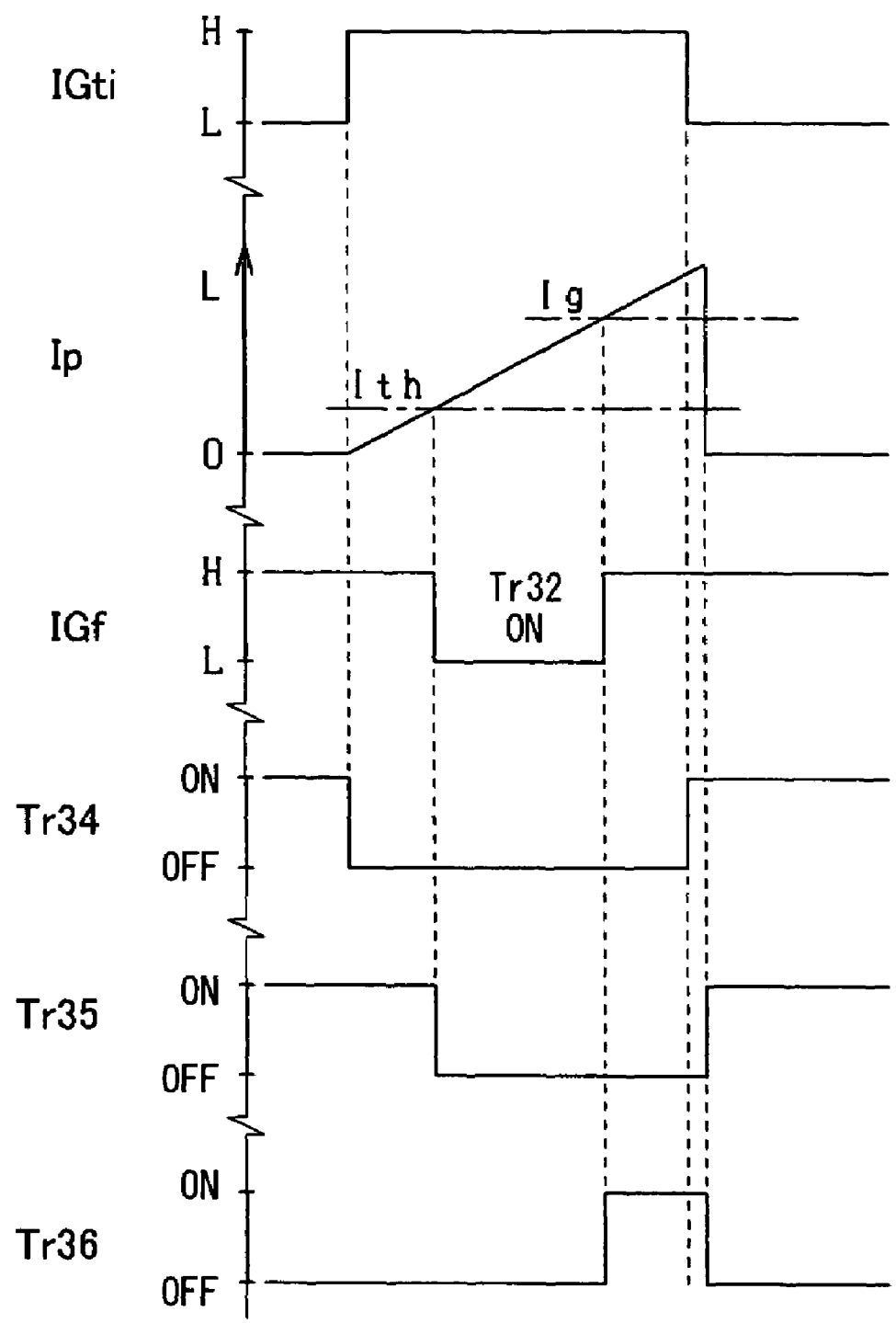
FIG. 3 is a time chart showing generation of a fail-safe signal in the igniter.

The igniter 20 generates the fail-safe signal IGf (more precisely, IGfi) as shown in FIG. 3, which also shows the ignition signal IGti, the current Ip flowing through the primary coil 14a, and operations of the first to the third switching transistors 34 to 36.

Before the ignition signal IGti rises from a low signal level L to a high signal level H, the fail-safe signal IGf is logically high because the first and the second switching transistors 34 and 35 are in the ON-state, short-circuiting the emitter and the base of the bipolar transistor 32 and consequently turning off the transistor 32. Accordingly, the potential of the signal wire LF is at the logically high potential of the power source 18.

The rising of the ignition signal IGti makes the output from the inverter 37 logically low, turning off the first switching transistor 34. The rising of the ignition signal IGti increases the current Ip through the primary coil 14a. The increased current Ip exceeds a low threshold current Ith corresponding to a low threshold voltage VL, so that the voltage across the resistor 31 exceeds the threshold voltage VL. This inverts the output from the comparator 38 to be logically low, turning off the second switching transistor 35. As long as the primary current Ip is lower than a high threshold current Ig indicated by a high threshold voltage VH, the comparator 39 maintains the third transistor 36 in the OFF-state. Thus, all the switching transistors 34 to 36 are turned off. This makes a threshold larger potential difference than a preset value between the base and the emitter of the bipolar transistor 32, so that this transistor 32 is turned on. As a result, the fail-safe signal IGf is inverted to be logically low.

The current Ip through the primary coil 14a further increases and becomes a specified current Ig corresponding to the high threshold voltage VH, so that the voltage across the resistor 31 exceeds the specified voltage VH, thereby making the output from the comparator 39 logically high. The high output turns on the third switching transistor 36. This short-circuits the base and the emitter of the bipolar transistor 32, so that this transistor 32 is turned off. As a result, the fail-safe signal IGf is inverted to be logically high. Subsequently, the ignition signal IGti is inverted to be logically low, so that the first switching transistor 34 is turned on again. The current Ip through the primary coil 14a becomes less than the specified current Ig, so that the third switching transistor 36 is turned off. The current Ip further becomes less than the threshold current Ith, so that the second switching transistor 35 is turned on.

Thus, the ignition signal IGti is output to cause the primary coil 14a to charge electric energy and then cause the secondary coil 14b to generate the high voltage ignition spark at the spark plug 12 by discharging the charged energy. In response to the ignition signal IGti, the fail-safe signal IGf becomes logically low when the current Ip through the primary coil 14a is not less than the threshold current Ith but less than the specified current Ig. Whether the fail-safe signal IGf is inverted to be logically low is the basis for determining whether the ignition coil 14 is charged for the coming discharge as the ignition spark by the secondary coil 14b and the spark plug.

In particular, when at least one of the three switching transistors 34 to 36 is turned on, the bipolar transistor 32 is turned off. Accordingly, when the bipolar transistor 32 is in the OFF-state, its base and emitter are short-circuited. Accordingly, even when the superposition of a radio noise on the signal wire LF causes a current to flow via the parasitic capacity between the collector and the base of the bipolar transistor 32, the resultant voltage between the base and the emitter of this transistor 32 may be disregarded. This makes it possible to keep the bipolar transistor 32 in the OFF-state regardless of the radio noise.

This makes it possible to take measures against noises only by connecting the low-capacity Zener diode 56 for overvoltage protection to the output terminal TF. That is, there is no need to connect a high-capacity capacitor to the output terminal TF so as to take measures against radio noises. This makes it possible to reduce the size of the igniter 20.

Figure 4:
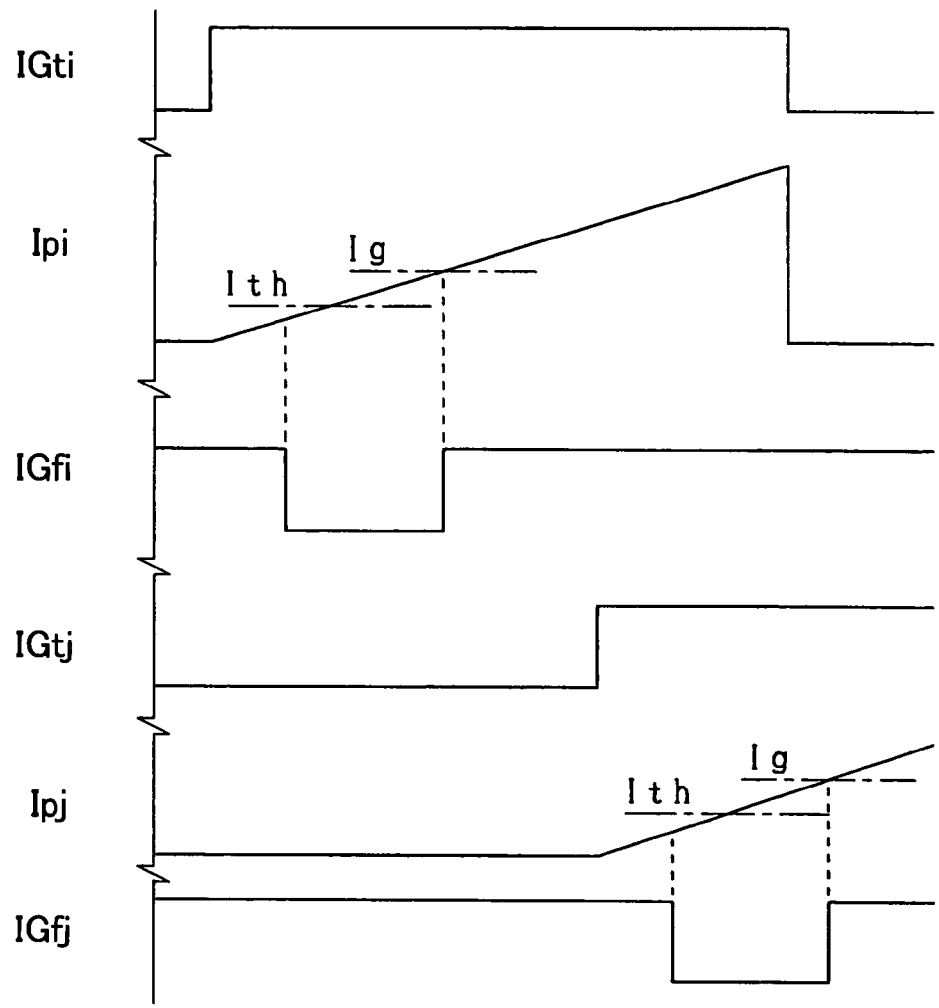
FIG. 4 is a time chart showing generation of a fail-safe signal of the igniter.
Figure 5:
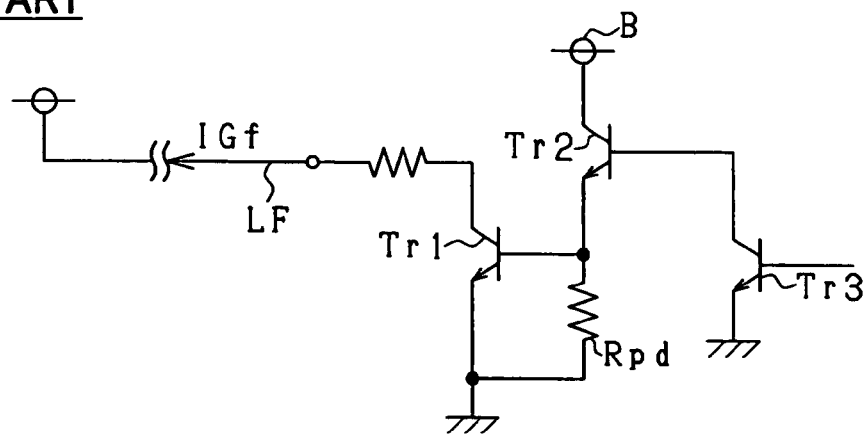
FIG. 5 is a circuit diagram showing a conventional output circuit.

The third switching transistor 36 of the igniter 20 functions to prevent the fail-safe signals IGfi (i=1 to n) from overlapping with one another among a plurality of igniters 20 when one ignition signal becomes long and overlaps the next ignition signal as shown in FIG. 4, which shows the ignition signal IGti for the i-th cylinder, the current Ipi flowing through the primary coil 14a for the i-th cylinder, the fail-safe signal IGfi output through the output terminal TF of the igniter 20 for the i-th cylinder, the ignition signal IGtj for the j-th cylinder, the current Ipj flowing through the primary coil 14a for the j-th cylinder, the fail-safe signal IGfj output through the output terminal TF of the igniter 20 for the j-th cylinder. The ignition signals IGti and IGtj overlap with each other. However, when the current through the primary coil 14a for each of these cylinders becomes the specified current Ig, the fail-safe signal IGfi or IGfj output through the associated output terminal TF is inverted to be logically high again. This prevents the period for which each of the fail-safe signals IGfi and IGfj is logically low from overlapping with the period for which the other signal is logically low. Consequently, the OR circuit 16 can generate a logical sum signal from the fail-safe signals IGfi and IGfj and output it as the fail-safe signal IGf to the ECU 10 through the signal wire LF, which is a serial line.

The above embodiment will provide the following advantages.

(1) The reduction of the resistance (for instance, short-circuiting) between the emitter and the base of the bipolar transistor 32 turns off this transistor 32. This makes it possible to keep the bipolar transistor 32 in the OFF-state even when a radio noise is superposed on the signal wire LF connecting the ECU 10 and the igniters 20.

(2) The switching transistors 34 to 36 can change the resistance between the emitter and the base of the bipolar transistor 32. This makes it possible to switch the resistance between the emitter and the base of the bipolar transistor 32 by turning on or off the switching transistors 34 to 36.

(3) The switching transistors 34 to 36 are connected between the base and the emitter of the bipolar transistor 32 and can be turned on or off under different conditions. This makes it possible to indicate the results of logical operations of the different conditions by turning on or off the bipolar transistor 32. Accordingly, the results of logical operations of the different conditions can be output to the signal wire.

(4) It is possible to well transmit the fail-safe signal IGf by outputting it through the collector of the bipolar transistor 32, when the resistance between the emitter and the base of this transistor 32 is high.

(5) The first switching transistor 34 is in the OFF-state for the duration of the ignition signal IGti, and the second switching transistor 35 is turned off when the current Ip through the primary coil 14a exceeds the threshold current Ith. This makes it possible to turn on the bipolar transistor 32 when the current Ip through the primary coil 14a exceeds the threshold current Ith while the ignition signal IGti is output.

(6) The third switching transistor 36 is turned on when the current through the primary coil 14a exceeds the specified current Ig, which is higher than the threshold current Ith. This makes it possible to limit the ON-period of the bipolar transistor 32 even when the ignition signal IGti is output for a long period. Accordingly, the fail-safe signal IGf can be transmitted suitably through the signal wire LF, which is common to all the cylinders.

The foregoing embodiment may be modified as follows.

(a) The circuitry in each igniter 20 is not limited to that shown in FIG. 2. The Zener diode 56 might be fitted in the IC including the bipolar transistor 32. The capacitor 52 might be omitted.

(b) The switching transistors 34 to 36, which form parts of a resistance changing means, are not limited to bipolar transistors but might be MOS transistors. The sources and the drains of the MOS transistors might be connected between the base and the emitter of the bipolar transistor 32. In any case, the signals output to the conduction control terminals (bases or gates) of the switching transistors depend on whether a specified condition is met, such as the condition that the ignition signal IGti should become logically high.

(c) When the signal wire LF is provided for each cylinder, the third switching transistor 36 might be omitted.

(d) The switching transistors 34, 35 and 36 connected between the base and the emitter of the bipolar transistor 32 might be replaced by one switching transistor, which could be turned off on the logical product condition that the ignition signal IGti should be output and that the primary current Ip more than the threshold current Ith should flow through the primary coil 14a.

(e) The bipolar transistor 32 which outputs the fail-safe signal IGf to the signal wire LF is not limited to the NPN transistor but might be a PNP transistor. A high voltage might be applied to the emitter of the PNP transistor. The collector of the PNP transistor might be grounded via a resistor and connected to the signal wire.

The output driver circuit of an on-vehicle electronic device is not limited to that mounted in the igniter 20. The output driver may be a suitable sensing member. Even in this case, the on-vehicle electronic device can be made less susceptible to radio noises without using a large element such as a capacitor.

What is claimed is:

1. An output circuit for an on-vehicle electronic device, comprising:
    a bipolar transistor having a base, a collector and an emitter, the emitter and the collector being connected to a low-potential side and a high-potential side, respectively;
    a signal wire connected to one of the collector and the emitter of the bipolar transistor so that the bipolar transistor outputs a signal therethrough; and
    a resistance changing circuit for changing a resistance between the emitter and the base of the bipolar transistor;
    wherein a reduction of the resistance by the resistance changing circuit turns off the bipolar transistor;
    the resistance changing circuit includes a plurality of switching elements connected to the emitter and the base of the bipolar transistor,
    the switching elements are adapted to be turned on or off under different conditions.

2. The output circuit as in claim 1, further comprising:
a discharging means for discharging electric energy by means of an ignition coil of an internal combustion engine based on an ignition signal; and
a determining means for determining whether the ignition coil has charged the electric energy;
wherein a determination result of the determining means is output to the signal wire by a change in the resistance of the resistance changing circuit.

3. The output circuit as in claim 2, wherein:
the plurality of switching elements of the resistance changing circuit includes
a first switching element connected between the base and the emitter of the bipolar transistor, the first switching element being adapted to be in an OFF-state for a duration of the ignition signal, and
a second switching element connected between the base and the emitter of the bipolar transistor, the second switching element being adapted to be turned off when a current through the ignition coil exceeds a threshold current.

4. The output circuit as in claim 3, wherein:
the plurality of switching elements of the resistance changing circuit further includes
a third switching element connected between the base and the emitter of the bipolar transistor, the third switching element being adapted to be turned on when the current through the ignition coil exceeds a specified current more than the threshold current.

5. An output circuit for an on-vehicle electronic device, comprising:
a bipolar transistor having a base, a collector and an emitter, the emitter and the collector being connected to a low-potential side and a high-potential side, respectively;
a signal wire connected to one of the collector and the emitter of the bipolar transistor, so that the bipolar transistor outputs a signal therethrough to an electronic control unit that controls the on-vehicle electronic device; and
a resistance changing circuit for changing a resistance between the emitter and the base of the bipolar transistor;
wherein a reduction of the resistance by the resistance changing circuit turns off the bipolar transistor,
wherein the resistance changing circuit includes a switching element connected to the emitter and the base of the bipolar transistor, and
wherein the switching element is adapted to be turned on or off under different conditions.

6. The output circuit as in claim 5, further comprising:
a discharging means for discharging electric energy by means of an ignition coil of an internal combustion engine based on an ignition signal; and
a determining means for determining whether the ignition coil has charged the electric energy,
wherein a determination result of the determining means is output to the signal wire by a change in the resistance of the resistance changing circuit.

7. The output circuit as in claim 5, wherein:
the switching element is turned off under a condition that an ignition signal for charging an ignition coil of an engine is output and a primary current in excess of a predetermined threshold flows in a primary winding of the ignition coil.

8. An output circuit for an ignition device including an ignition coil of an engine, which is controlled by an ignition signal produced by an electronic control unit, the output circuit comprising:
a transistor having a base, a collector and an emitter, one of the emitter and the collector being connected to a low-potential side and the other of the emitter and the collector being connected to a high-potential side;
a signal wire connected to the one of the emitter and the collector of the transistor so that the transistor applies a signal to the electronic control unit therethrough; and
a resistance changing circuit connected to the base of the transistor for changing a resistance by which a base current of the transistor is controlled,
wherein the resistance changing circuit includes one or more switches configured to reduce the resistance to turn off the transistor under a condition that the ignition signal is produced and a primary current flowing in the ignition coil is in excess of a predetermined threshold.

9. An output circuit for an on-vehicle electronic device, comprising:
a bipolar transistor having a base, a collector and an emitter, the emitter and the collector being connected to a low-potential side and a high-potential side, respectively;
a signal wire connected to one of the collector and the emitter of the bipolar transistor so that the bipolar transistor outputs a signal therethrough;
a resistance changing circuit for changing a resistance between the emitter and the base of the bipolar transistor, wherein a reduction of the resistance by the resistance changing circuit turns off the bipolar transistor;
a discharging circuit for discharging electric energy by means of an ignition coil of an internal combustion engine based on an ignition signal; and
a determining circuit for determining whether the ignition coil has charged the electric energy;
wherein a determination result of the determining circuit is output to the signal wire by a change in the resistance of the resistance changing circuit.

10. The output circuit as in claim 9, wherein:
the resistance changing circuit includes
a first switching element connected between the base and the emitter of the bipolar transistor, the first switching element being adapted to be in an OFF-state for a duration of the ignition signal, and
a second switching element connected between the base and the emitter of the bipolar transistor, the second switching element being adapted to be turned off when a current through the ignition coil exceeds a threshold current.

11. The output circuit as in claim 9, wherein:
the resistance changing circuit further includes
a third switching element connected between the base and the emitter of the bipolar transistor, the third switching element being adapted to be turned on when the current through the ignition coil exceeds a specified current more than the threshold current.

* * * * *